(12) United States Patent
Norte et al.

(10) Patent No.: US 6,429,370 B1
(45) Date of Patent: Aug. 6, 2002

(54) SELF-ADHERING ELECTROMAGNETIC INTERFERENCE DOOR SEAL

(75) Inventors: David A. Norte; Woong K. Yoon, both of Westminster, CO (US)

(73) Assignee: Avaya Technology Corp., Basking Ridge, NJ (US)

(*) Notice: Subject to any disclaimer, the term of this patent is extended or adjusted under 35 U.S.C. 154(b) by 0 days.

(21) Appl. No.: 09/651,708

(22) Filed: Aug. 31, 2000

(51) Int. Cl.[7] .............................................. H05K 9/00
(52) U.S. Cl. ........................ 174/35 GC; 174/35 MS; 220/223; 219/736
(58) Field of Search ........................... 277/919, 920; 439/927; 361/799, 800, 816, 818; 220/223, 230; 219/736, 744

(56) References Cited

U.S. PATENT DOCUMENTS

| | | | | |
|---|---|---|---|---|
| 3,969,572 A | * | 7/1976 | Rostek | 174/35 MS |
| 4,046,983 A | * | 9/1977 | Ishino et al. | 219/10.55 D |
| 4,602,141 A | * | 7/1986 | Naito et al. | 219/10.55 D |
| 4,642,416 A | * | 2/1987 | Rogner | 174/35 GC |
| 4,785,148 A | * | 11/1988 | Mayer | 219/10.55 D |
| 4,868,358 A | * | 9/1989 | Yamasaki | 219/10.55 D |
| 5,534,663 A | * | 7/1996 | Rivers et al. | 174/35 GC |

OTHER PUBLICATIONS

*Soft Ferrites Properties and Applications*, E.C. Snelling, 1988, Butterworth & Co. Ltd. pp. 7–18.

\* cited by examiner

*Primary Examiner*—Dean A. Reichard
*Assistant Examiner*—Carmelo Oliva
(74) *Attorney, Agent, or Firm*—John C. Moran

(57) ABSTRACT

Using a new compound to produce a magnetic tape having low electrical resistivity and high magnetic absorptivity. The magnetic tape self-adheres around a cabinet door opening such that when a cabinet door is closed, the magnetic tape provides an EMI seal with low electrical resistivity and high magnetic absorptivity. In addition, the magnetic tape electrically connects the door to the cabinet. To achieve greater EMI shielding, separate magnetic tape pieces can be positioned on both the cabinet and cabinet door. The compound is of a magnetically lossy Manganese-Zinc (soft ferrite material) having a complex permeability plus cobalt, nickel, or iron (ferromagnetic materials). The Manganese-Zinc material may be Product 3S1, 3S4, 3C11, 3E25 or 3E27 manufactured by the Phillips Corporation of The Netherlands which is readily commercially available.

12 Claims, 3 Drawing Sheets

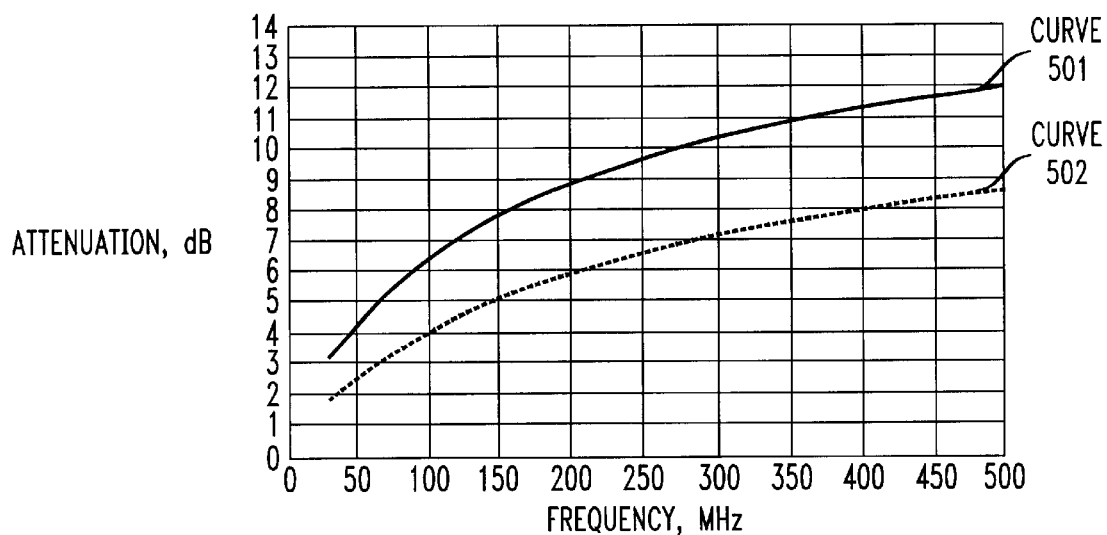
FIG. 5
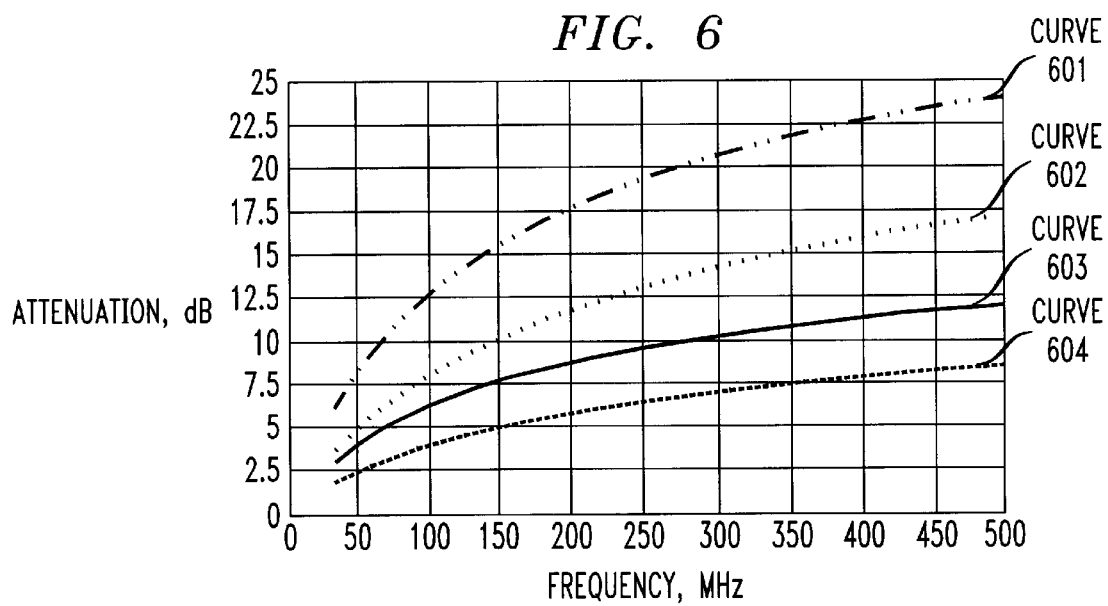
FIG. 6
FIG. 7
| FERRITE MATERIAL NO. | $\mu i$ AT 25°C | $B_{sat}$ (mt) AT 25°C | $T_c$ | $\rho(\Omega m)$ |
|---|---|---|---|---|
| 3S1 | 4000 | ~400 | =125 | ~1 |
| 3C11 | 4300 | ~400 | =125 | ~1 |
| 3E25 | 6000 | ~400 | =125 | ~0.05 |
| 3E27 | 6000 | ~480 | =175 | ~0.5 |

SELF-ADHERING ELECTROMAGNETIC INTERFERENCE DOOR SEAL

TECHNICAL FIELD

This invention relates to electrical interference shielding and, in particular, to a self-adhering electromagnetic interference seal for a door on a cabinet.

BACKGROUND OF THE INVENTION

In systems such as telecommunications switching systems or computer systems, electromagnetic interference (EMI) can leak through the surface between a door and a cabinet frame of such a system. The prior art has attempted to prevent this leakage by using gaskets that are a flexible metal sheath woven around a foam or rubber type of core. These gaskets must be tucked into a channel around the periphery of the door in order to be installed correctly. Subsequent closing of the door then allows electrical contact to occur between the door and the cabinet frame via the gasket. Problems occur in inserting these gaskets into the channel around the door. Mechanical insertion of these gaskets must be correctly executed in order to obtain their optimal performance. This typically requires meticulous use of tools to properly and fully insert the gasket. Repetition of these insertion methods can lead to physical effects on the workers performing the methods such as carpal tunnel syndrome and sore fingers. In addition, such techniques are labor intensive, hence are expensive. Also, the repetitive opening and closing of the door can cause, over time, excessive wearing of the gasket and can degrade the performance of the gasket.

SUMMARY OF THE INVENTION

The foregoing problems are solved and a technical advance is achieved by an apparatus and method that uses a new compound to produce a magnetic tape having low electrical resistivity and high magnetic absorptivity. The magnetic tape self-adheres around a cabinet door opening such that when a cabinet door is closed, the magnetic tape provides an EMI seal with low electrical resistivity and high magnetic absorptivity. In addition, the magnetic tape electrically connects the door to the cabinet. To achieve greater EMI shielding, separate magnetic tape pieces can be positioned on both the cabinet and cabinet door. Advantageously, the compound is of a magnetically lossy Manganese-Zinc (soft ferrite material) having a complex permeability plus cobalt, nickel, or iron (ferromagnetic materials). The Manganese-Zinc material may advantageously be Product 3S1, 3C11, 3E25 or 3E27 manufactured by the Phillips Corporation of The Netherlands which is readily commercially available.

These and other features and advantages of the invention will become apparent from the following description of the illustrated embodiment of the invention considered together with the drawing.

BRIEF DESCRIPTION OF THE DRAWING

FIGS. 5 and 6 illustrate, in graphical form, attenuation curves for the magnetic tape in accordance with the invention; and FIG. 7 illustrates a table of materials.

DETAILED DESCRIPTION

Figure 1:
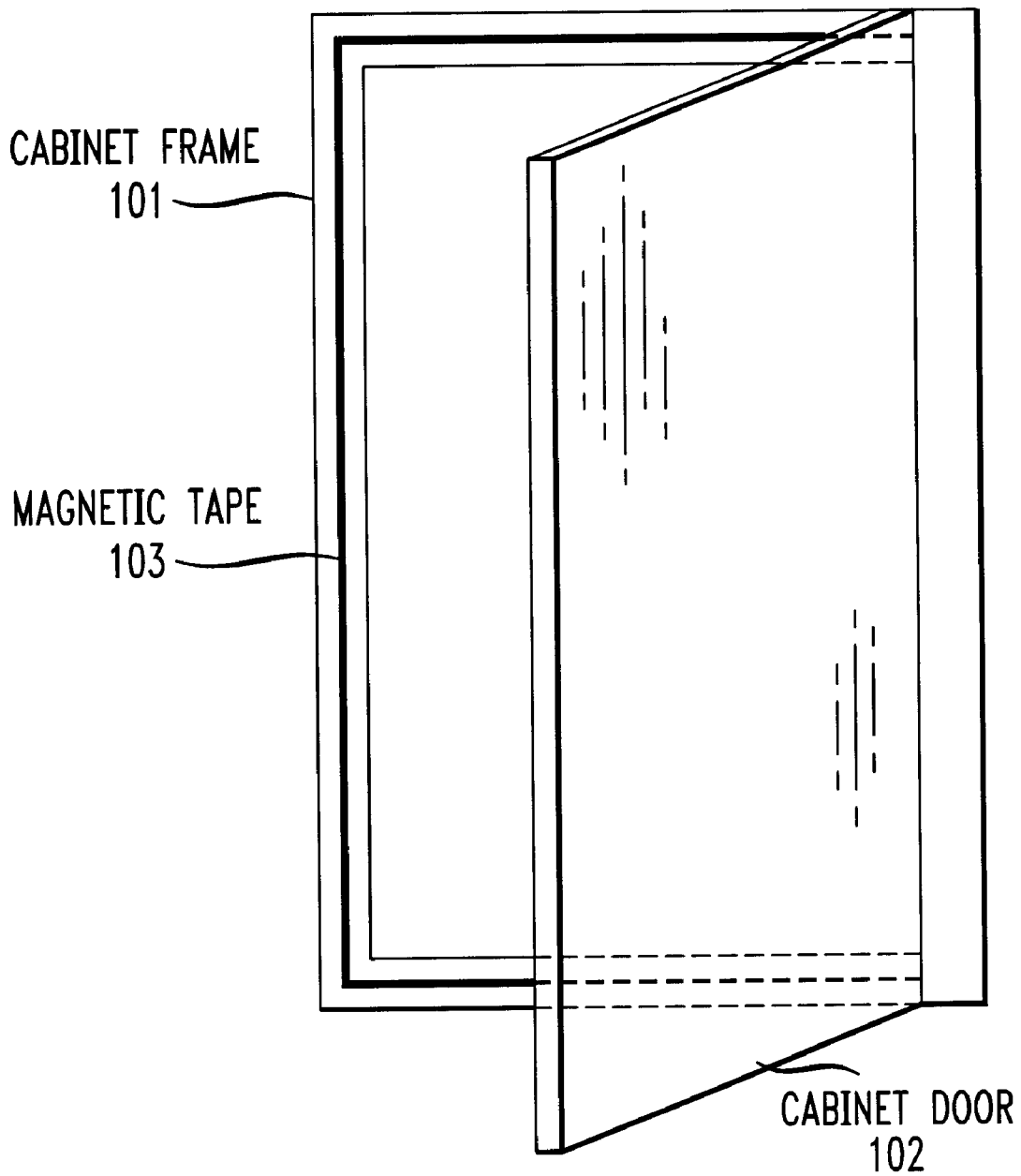
FIG. 1 illustrates an embodiment of the invention.

FIG. 1 illustrates a first embodiment of the invention. Magnetic tape 103 adheres magnetically to cabinet frame 101 completely surrounding the cabinet door opening. Cabinet door 102 upon making contact with magnetic tape 103 in the closed position then completes an EMI shield against any stray electromagnetic waves that could leak from the inside of the cabinet. In addition, magnetic tape 103 provides good electrical conductivity between cabinet door 102 and cabinet frame 101. Advantageously, magnetic tape 103 has an electrical conductivity of 1.0 to 2.0 $(\Omega m)^{-1}$.

Figure 2:
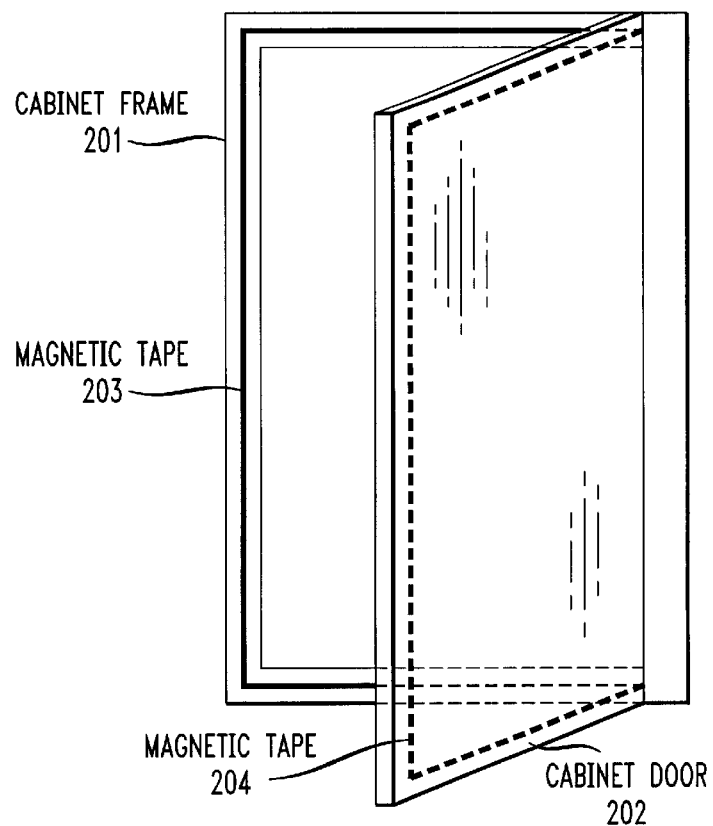
FIG. 2 illustrates another embodiment of the invention.

FIG. 2 illustrates a second embodiment of the invention. In the second embodiment of the invention, magnetic tape 203 adheres magnetically to cabinet frame 201 completely surrounding the cabinet door opening, and magnetic tape 204 adheres to the outer edge of cabinet door 202 positioned so as to make contact with magnetic tape 203 when the cabinet door is in the closed position. Cabinet door 202 in the closed position brings magnetic tape 203 and magnetic tape 204 into contact and completes an EMI shield that prevents the leakage of stray electromagnetic waves from the inside of the cabinet. Magnetic tapes 203 and 204 are placed on their respective surfaces such that the same polarity is against the attaching surface. For example, the north pole domains of magnetic tape 203 would be positioned in contact with cabinet frame 201, and the north poles of magnetic tape 204 would be positioned against cabinet door 202. Not illustrated in FIGS. 1 and 2, is the mechanical latch that would hold the cabinet doors in the closed position against the cabinet frames.

Figure 3:
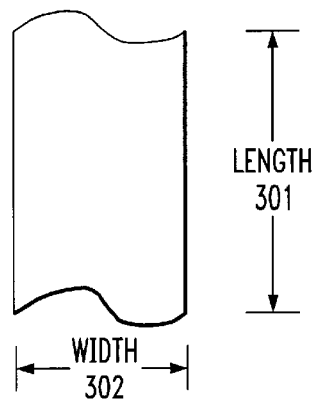
FIGS. 3 and 4 illustrate top and front views of a door seal in accordance with the invention.
Figure 4:

FIGS. 3 and 4 illustrate top and front views of the magnetic tape. Length 301 is whatever length is necessary in order to surround a cabinet opening such as shown in FIG. 1. Thickness 401 advantageously can be approximately 0.03 inches, and width 302 is determined by the amount of electrical magnetic attenuation that is desired with reference to FIGS. 5 and 6. In FIG. 5, curve 501 represents a material which is 0.5 inches in width with an electrical conductivity, $\sigma$, equal to 2.0 $(\Omega m)^{-1}$, and curve 502 represents a material which is 0.5 inches in width with a $\sigma$ equal to 0.001 $(\Omega m)^{-1}$. Note, the additional attenuation provided by the higher conductivity material, as characterized by the materials comprising the invention. In FIG. 6, curve 601 represents a material which is 1.0 inches in width with a $\sigma$ equal to 2.0 $(\Omega m)^{-1}$, curve 602 represents a material which is 1.0 inches in width with a $\sigma$ equal to 0.001 $(\Omega m)^{-1}$, curve 603 represents a material which is 0.5 inches in width with a $\sigma$ equal to 2.0 $(\Omega m)^{-1}$, and curve 604 represents a material which is 0.5 inches in width with a $\sigma$ equal to 0.001 $(\Omega m)^{-1}$. In general, width 302 may advantageously be 0.5 inches. FIG. 7 illustrates a table of suitable soft ferrite materials.

The process used for producing the magnetic tape using the specified materials is well known to those skilled in the art. For example, this process is described in the book entitled *Soft Ferrites Properties and Applications*, E. C. Snelling, 1988, Butterworth & Co. Ltd, on pages 7–18.

Of course, various changes and modifications to the illustrated embodiments described above will be apparent to those skilled in the art. Such changes and modifications can be made without departing from the spirit and scope of the invention and without diminishing its attendant advantages. It is therefore intended that such changes and modifications be covered by the following claims except insofar as limited by the prior art.

What is claimed is:

1. An apparatus for preventing electromagnetic radiation escaping from a cabinet between a cabinet frame and a cabinet door where the cabinet frame has ferromagnetic characteristics, comprising:

the cabinet door connected to the cabinet frame and positioned on the cabinet frame so as to cover a cabinet opening In the cabinet frame upon the cabinet door being in the closed position; and a self-adhering tape placed around a periphery of the cabinet opening such that the self-adhering tape is between the cabinet frame and cabinet door upon the cabinet door being in the closed position where the self-adhering tape comprises a compound comprising a ferromagnetic material and a soft ferrite material wherein the ferromagnetic material adheres the self-adhering tape to the periphery of the cabinet opening and the soft ferrite material prevents the electromagnetc radiation from escaping between the cabinet frame and the cabinet door.

2. The apparatus of claim 1 wherein the soft ferrite material is a magnetically lossy manganese-zinc material having a complex permeability.

3. The apparatus of claim 2 wherein the soft ferrite material has an electrical conductivity of 1.0 to 2.0 (ohms-meters)$^{-1}$.

4. The apparatus of claim 3 wherein the ferromagnetic material is iron.

5. The apparatus of claim 3 wherein the ferromagnetic material is nickel.

6. The apparatus of claim 3 wherein the ferromagnetic material is cobalt.

7. An apparatus for preventing electromagnetic radiation escaping from a cabinet between a cabinet frame and a cabinet door where the cabinet frame has ferromagnetic characteristics, comprising:

the cabinet door connected to the cabinet frame and positioned on the cabinet frame so as to cover a cabinet opening in the cabinet frame upon the cabinet door being in the closed position;

a first self-adhering tape placed around a periphery of the cabinet opening such that the first self-adhering tape is between the cabinet frame and cabinet door upon the cabinet door being in the closed position;

a second self-adhering tape placed around the cabinet door such that the second self-adhering tape is positioned against the first self-adhering tape upon the cabinet door being In the closed position where the first and second self-dowering tapes comprise a compound comprising a ferromagnetic material and a soft ferrite material wherein the ferromagnetic material adheres the first self-adhering tape to the periphery of the cabinet opening and the second self-adhering tape adheres the second self-adhering tape to the cabinet door and the soft ferrite material of both the first and second self-adhering tapes prevents the electromagnetic radiation from escaping between the cabinet frame and the cabinet door.

8. The apparatus of claim 7 wherein the soft ferrite material is a magnetically lossy manganese-zinc material having a complex permeability.

9. The apparatus of claim 8 wherein the soft ferrite material has an electrical conductivity of 1.0 to 2.0 (ohms-meters)$^{-1}$.

10. The apparatus of claim 9 wherein the ferromagnetic material is iron.

11. The apparatus of claim 9 wherein the ferromagnetic material is nickel.

12. The apparatus of claim 9 wherein the ferromagnetic material is cobalt.

* * * * *